US009442675B2

(12) United States Patent
Chai et al.

(10) Patent No.: US 9,442,675 B2
(45) Date of Patent: Sep. 13, 2016

(54) REDIRECTING DATA FROM A DEFECTIVE DATA ENTRY IN MEMORY TO A REDUNDANT DATA ENTRY PRIOR TO DATA ACCESS, AND RELATED SYSTEMS AND METHODS

(71) Applicant: QUALCOMM Incorporated, San Diego, CA (US)

(72) Inventors: Chiaming Chai, Cary, NC (US); Shaoping Ge, Cary, NC (US); Stephen Edward Liles, Apex, NC (US)

(73) Assignee: QUALCOMM Incorporated, San Diego, CA (US)

( * ) Notice: Subject to any disclaimer, the term of this patent is extended or adjusted under 35 U.S.C. 154(b) by 441 days.

(21) Appl. No.: 14/017,760

(22) Filed: Sep. 4, 2013

(65) Prior Publication Data

US 2014/0337573 A1 Nov. 13, 2014

Related U.S. Application Data

(60) Provisional application No. 61/820,945, filed on May 8, 2013.

(51) Int. Cl.
*G06F 12/00* (2006.01)
*G06F 3/06* (2006.01)
*G11C 29/00* (2006.01)

(52) U.S. Cl.
CPC ............ *G06F 3/0689* (2013.01); *G06F 3/0619* (2013.01); *G06F 3/0665* (2013.01); *G11C 29/848* (2013.01); *G11C 29/785* (2013.01)

(58) Field of Classification Search
CPC .. G06F 3/0689; G06F 3/0619; G06F 3/0665; G11C 29/848; G11C 29/785

USPC ......................................................... 711/114
See application file for complete search history.

(56) References Cited

U.S. PATENT DOCUMENTS 5,841,712 A   11/1998  Wendell et al.
6,192,486 B1  2/2001   Correale, Jr. et al.
(Continued)

FOREIGN PATENT DOCUMENTS

GB        2165378 A    4/1986
JP        S63291289 A  11/1988
(Continued)

OTHER PUBLICATIONS

Second Written Opinion for PCT/US2014/036517, mailed Apr. 22, 2015, 9 pages.

(Continued)

*Primary Examiner* — Matthew Bradley
(74) *Attorney, Agent, or Firm* — Withrow & Terranova, PLLC

(57) ABSTRACT

Embodiments disclosed include redirecting data from a defective data entry in memory to a redundant data entry prior to data access. Related systems and methods are also disclosed. The memory is configured to receive a memory access request. The received memory access request comprises a data entry address. The memory uses the data entry address to access data stored in a data array in the memory in a first data access path. It is possible that the rows or columns in the memory may be defective as a result of a manufacturing process. In the event that a row or column at the data entry address in the data array is defective, a data entry redirection circuit redirects the memory access request to a redundant row or column in the data array prior to data access.

24 Claims, 5 Drawing Sheets

(56) References Cited

U.S. PATENT DOCUMENTS

| | | |
|---|---|---|
| 6,324,103 B2 | 11/2001 | Hiraki et al. |
| 6,944,072 B2 | 9/2005 | Micheloni et al. |
| 7,289,364 B2 | 10/2007 | Zanardi |
| 7,379,359 B2 | 5/2008 | Sakakibara |
| 8,228,749 B2 | 7/2012 | Deng et al. |
| 8,279,687 B2 | 10/2012 | Adams et al. |
| 8,339,892 B2 | 12/2012 | Kishibe |
| 8,351,287 B1 | 1/2013 | Sood et al. |
| 2009/0067271 A1 | 3/2009 | Yamaguchi et al. |
| 2009/0164727 A1 | 6/2009 | Penton et al. |
| 2010/0232202 A1 | 9/2010 | Lu et al. |
| 2012/0213023 A1 | 8/2012 | Dawson et al. |
| 2013/0021864 A1 | 1/2013 | Deng et al. |

FOREIGN PATENT DOCUMENTS

| | | |
|---|---|---|
| JP | H02244479 A | 9/1990 |
| JP | 2001076489 A | 3/2001 |
| JP | 2001319479 A | 11/2001 |
| JP | 2009064532 A | 3/2009 |
| JP | 2011501341 A | 1/2011 |
| WO | 2009052014 A1 | 4/2009 |
| WO | 2013049763 A1 | 4/2013 |

OTHER PUBLICATIONS

Second Written Opinion for PCT/US2014/036936, mailed May 7, 2015, 8 pages.
Co-pending U.S. Appl. No. 14/049,312, filed Oct. 9, 2013.
International Search Report and Written Opinion for PCT/US2014/036517, mailed Sep. 16, 2014, 11 pages.
International Search Report and Written Opinion for PCT/US2014/036936, mailed Sep. 19, 2014, 11 pages.
International Preliminary Report on Patentability for PCT/US2014/036517, mailed Aug. 4, 2015, 23 pages.
Third Written Opinion for PCT/US2014/036936, mailed Jul. 23, 2015, 9 pages.
International Preliminary Report on Patentability for PCT/US2014/036936, mailed Oct. 19, 2015, 27 pages.
Notice to File a Response for Korean Patent Application No. 10-2015-7034407, dated Jan. 7, 2016, 8 pages.
Notice of Reasons for Rejection for Japanese Patent Application No. 2016-512966, mailed Apr. 18, 2016, 15 pages.

REDIRECTING DATA FROM A DEFECTIVE DATA ENTRY IN MEMORY TO A REDUNDANT DATA ENTRY PRIOR TO DATA ACCESS, AND RELATED SYSTEMS AND METHODS

PRIORITY CLAIM

The present application claims priority to U.S. Provisional Patent Application Ser. No. 61/820,945 filed on May 8, 2013 and entitled "METHODS AND APPARATUSES FOR REDIRECTING DEFECTIVE DATA ENTRIES TO REDUNDANT DATA ENTRIES PRIOR TO DATA ARRAY ACCESSES, AND RELATED SYSTEMS AND METHODS," which is incorporated herein by reference in its entirety.

BACKGROUND

I. Field of the Disclosure

The technology of the disclosure relates generally to computer memory, and more particularly to accessing data in computer memory.

II. Background

A memory cell is a basic building block of computer data storage, which is also known as "memory." A computer system may either read data from or write data to memory. Memory can be used to provide cache memory in a central processing unit (CPU) system as an example. Cache memory may be comprised of a tag array and a data array. The tag array performs the function of retaining an index of memory addresses stored in a higher performing data array functioning as cache memory. The data array contains the data values referenced by the index of memory addresses in the tag array. The tag array receives a memory address indicating which memory address the CPU needs to access for a read or write operations. If the received memory address matches a tag entry in the tag array, a cache hit occurs meaning the data corresponding to the memory address is present in the data array. If the received memory address does not match a tag entry in the tag array, a cache miss occurs. In this instance, the data must be retrieved from either a higher level cache or main memory.

A data array in a cache memory may be comprised of static random access memory (SRAM) bitcells to provide a SRAM data array. The SRAM data array is organized in rows and columns of SRAM bitcells, in which a single data item or bit can be stored. Access to the row containing a plurality of SRAM bitcells is controlled by a corresponding wordline for read and write operations. The wordline controls access to the SRAM bitcell for both read and write operations by selecting a desired row of SRAM bitcells for read or write operations. To read data from a SRAM bitcell, a wordline is asserted to select a desired row of SRAM bitcells. For a read operation, data read from the selected SRAM bitcell is placed on a set of corresponding bitlines. For a write operation, data to be written to the SRAM bitcell is placed on the set of corresponding bitlines for the SRAM bitcell.

It may be desired to provide memory, including cache memory, in smaller geometries in a semiconductor die as the sizes of semiconductor packaging are reduced. However, providing memory in smaller geometries can decrease semiconductor manufacturing yields. Providing memory in smaller geometries can also increase the number of defective rows or columns present in the memory. In this regard, some rows and/or columns in a data array of the memory may be used as redundant rows or columns to be used in place of defective rows or columns. A method to implement row or column redundancy within a data array of memory may include utilizing a static multiplexer system. The static multiplexer system utilizes a multiplexer for each row or column in the data array to bypass a defective row or column in the data array based on a static index indicating a defective row and/or column. For high performance or high data capacity memory, the data array may be divided into smaller data sub-arrays, also called "sub-arrays." Each sub-array in the memory may have dedicated periphery circuits such as row decoders, write drivers, sense amplifiers, and control/clocking circuitry.

However, static multiplexers may not operate efficiently for row or column redundancy in a data array that utilizes sub-arrays. Static multiplexers may not operate efficiently, because each sub-array will have separate, dedicated row index decoding, wire routing, sense amplifiers, and control/clocking circuitry. Thus, with this memory redundancy configuration, it may be more practical or desirable to have redundant rows or columns designed or configured within each sub-array. To configure redundant rows or columns within each sub-array of a memory requires increased area for the additional redundant rows or columns to be manufactured within each sub-array in order to provide redundant rows or columns.

SUMMARY OF THE DISCLOSURE

Embodiments disclosed include redirecting data from a defective data entry in memory to a redundant data entry prior to data access. Related systems and methods are also disclosed. The embodiments disclosed herein may be employed in cache memory that includes a static random access memory (SRAM) data array as a non-limiting example. The memory is configured to receive a memory access request. The received memory access request comprises a data entry address. The memory uses the data entry address to access data stored in a data array in the memory in a first data access path. It is possible that the rows or columns in the memory may be defective as a result of a manufacturing process. In the event that a row or column at the data entry address in the data array is defective, a data entry redirection circuit redirects the memory access request to a redundant row or column in the data array.

In embodiments disclosed herein, latency of memory access to the data array is not increased as a result of the data entry redirection. To avoid or reduce latency of the data entry redirection circuit adding latency to the memory access, the data entry redirection circuit is not provided in the first data access path of the memory in embodiments discussed herein. The data entry redirection circuit is provided in a second data access path in the memory outside the first data access path. The data entry redirection circuit receives the same data entry address for the memory access request in the second data access path. The data entry redirection circuit redirects the data entry address to a redundant row or column in the data array if the data entry address points to a defective row or column in the data array. By providing the data entry redirection circuit in the second data access path outside of the first data access path, the data entry redirection circuit can determine if the requested data entry address is defective and redirect the memory access request to a redundant row or column in the data array prior to the data entry access in the data array at the data entry address. Further, to avoid latency of the data entry redirection circuit adding latency to the memory access, the latency of the second data access path containing the data entry redirection circuit is less than the latency of the first data access path. Thus, the memory access latency will be the latency of the first data access path.

In this regard in one embodiment, a memory is provided. The memory comprises a memory access logic circuit provided in a first data access path. The memory access logic circuit is configured to receive at least a portion of a data entry address of a memory access request as an input for addressing a data entry in a data array in the first data access path. The memory access logic circuit is further configured to generate an index as an output in the first data access path comprising a data entry address index to index the data array to access the data entry in the data array corresponding to the at least a portion of the data entry address.

The memory further comprises a data entry redirection circuit. The data entry redirection circuit comprises a defective data entry comparator circuit provided in a second data access path separate from the first data access path. The defective data entry comparator circuit is configured to, prior to indexing the data entry in the data array, receive at least one defective data entry address as an input from a defective data entry index register representative of the at least one defective data entry address in the data array at a comparator second input. The defective data entry comparator circuit is further configured to compare the at least a portion of the data entry address to the received at least one defective data entry address. The defective data entry comparator circuit is further configured to generate a redirection index as an output in the second data access path comprising a redirection data entry address index. The defective data entry comparator circuit generates the redirection index to a redundant data entry in the data array if the received at least a portion of the data entry address matches the received at least one defective data entry address. The data entry redirection circuit further comprises a data entry address index selector configured to select the redirection index to index the data array if the received at least a portion of the data entry address does match the received at least one defective data entry address. The comparison of the received at least a portion of the data entry address to the received at least one defective data entry address is performed in the second data access path prior to indexing the data entry in the data array at the at least a portion of the data entry address. In this manner, the defective data entry determination does not have to be performed as part of the memory access request data path, which would increase memory access latency. The defective data entry determination may be performed prior to the access to the data array in the second data access path so as to not increase latency of the memory access.

In another embodiment, a memory is provided. The memory comprises a memory access logic circuit means provided in a first data access path means. The memory access logic circuit means is configured to receive at least a portion of a data entry address means of a memory access request means as an input for addressing a data entry means in a data array means in the first data access path means. The memory access logic circuit means is further configured to generate an index means as an output in the first data access path means comprising a data entry address index means to index the data array means to access a data entry means in the data array means corresponding to the at least a portion of the data entry address means.

The memory further comprises a data entry redirection circuit means. The data entry redirection circuit means comprises a defective data entry comparator circuit means provided in a second data access path means separate from the first data access path means. The defective data entry comparator circuit means is configured to, prior to indexing the data entry means in the data array means, receive at least one defective data entry address means as an input from a defective data entry index register means representative of the at least one defective data entry address means in the data array means at a comparator second input means. The defective data entry comparator circuit means is further configured to compare the at least a portion of the data entry address means to the received at least one defective data entry address means. The defective data entry comparator circuit means is further configured to generate a redirection index means as an output in the second data access path means comprising a redirection data entry address index means, to a redundant data entry means in the data array means if the received at least a portion of the data entry address means matches the received at least one defective data entry address means. The data entry redirection circuit means further comprises a data entry address index selector means configured to select the redirection index means to index the data array means if the received at least a portion of the data entry address means does match the at least one received defective data entry address means.

In another embodiment, a method of redirecting a defective data entry to a redundant data entry in a data array is provided. The method comprises receiving at least a portion of a data entry address of a memory access request in a first data access path and a second data access path for indexing a data entry in a data array. The method further comprises indexing the data entry in the data array in the first data access path at a data entry index representative of the at least a portion of the data entry address. The method further comprises comparing the at least a portion of the data entry address to a defective data entry address representative of a defective data entry in the data array in a defective data entry address comparator circuit in the second data access path, prior to indexing the data entry at the at least a portion of the data entry address. The method further comprises indexing the data entry in the data array at a redirection index as the data entry index, if the comparison generates a match between the at least a portion of the data entry address and the defective data entry address. The method further comprises accessing the data entry in the data array at the redirection index as the data entry index, if the comparison generates the match between the at least a portion of the data entry address and the defective data entry address.

DETAILED DESCRIPTION

Figure 1:
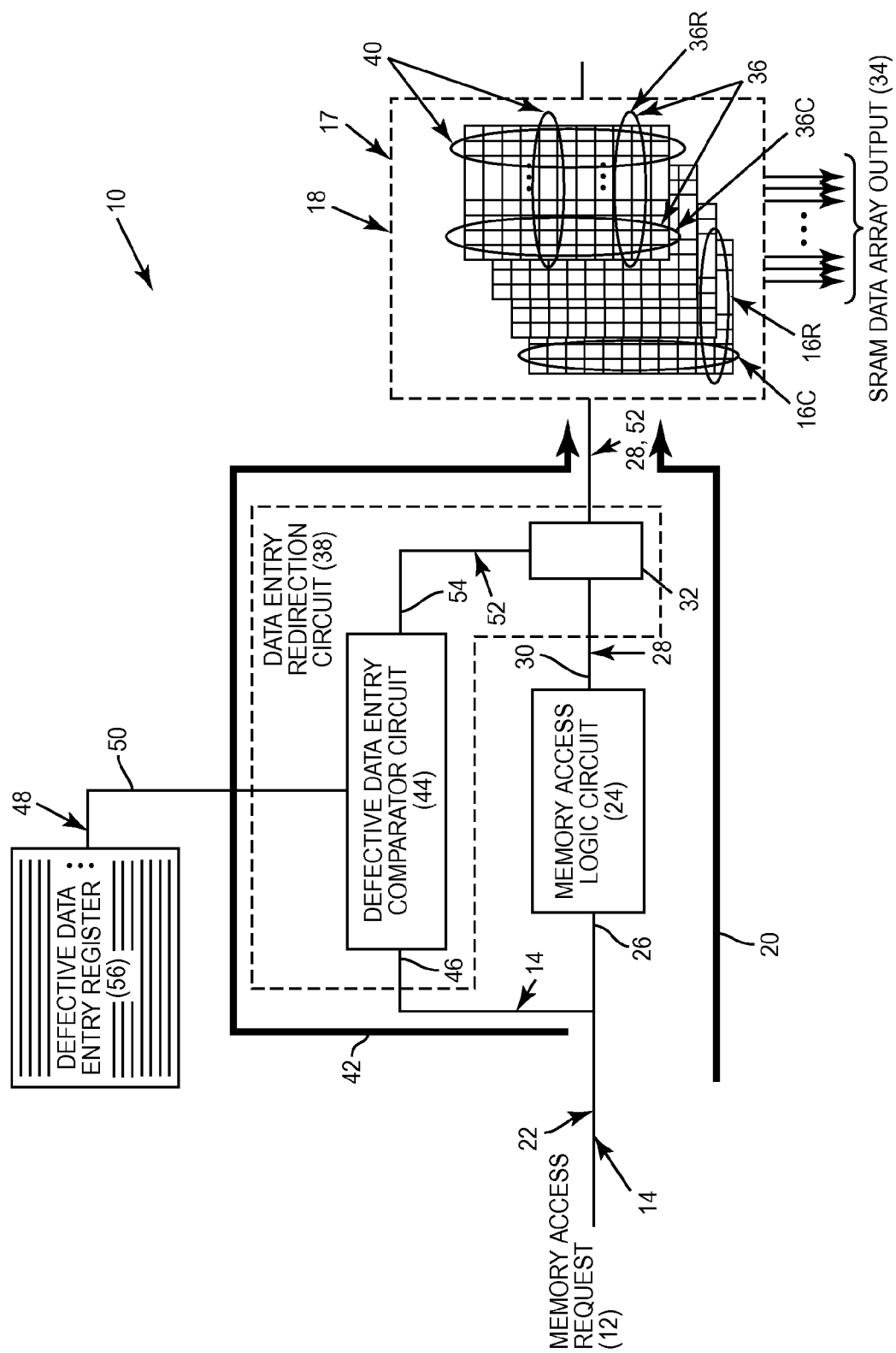
FIG. 1 is a schematic diagram of an exemplary memory that includes a data entry redirection circuit for selecting a redundant data entry in a data array of the memory, if the data entry at a data address for a memory access request is defective, prior to the data entry access in the data array.

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

Embodiments disclosed include redirecting data from a defective data entry in memory to a redundant data entry prior to data access. Related systems and methods are also disclosed. The embodiments disclosed herein may be employed in cache memory that includes a static random access memory (SRAM) data array as a non-limiting example. The memory is configured to receive a memory access request. The received memory access request comprises a data entry address. The memory uses the data entry address to access data stored in a data array in the memory in a first data access path. It is possible that the rows or columns in the memory may be defective as a result of a manufacturing process. In the event that a row or column at the data entry address in the data array is defective, a data entry redirection circuit redirects the memory access request to a redundant row or column in the data array.

In embodiments disclosed herein, latency of memory access to the data array is not increased as a result of the data entry redirection. To avoid or reduce latency of the data entry redirection circuit adding latency to the memory access, the data entry redirection circuit is not provided in the first data access path of the memory in embodiments discussed herein. The data entry redirection circuit is provided in a second data access path in the memory outside the first data access path. The data entry redirection circuit receives the same data entry address for the memory access request in the second data access path. The data entry redirection circuit redirects the data entry address to a redundant row or column in the data array if the data entry address points to a defective row or column in the data array. By providing the data entry redirection circuit in the second data access path outside of the first data access path, the data entry redirection circuit can determine if the requested data entry address is defective and redirect the memory access request to a redundant row or column in the data array prior to the data entry access in the data array at the data entry address. Further, to avoid latency of the data entry redirection circuit adding latency to the memory access, the latency of the second data access path containing the data entry redirection circuit is less than the latency of the first data access path. Thus, the memory access latency will be the latency of the first data access path.

In this regard, FIG. 1 illustrates a schematic diagram of an exemplary memory 10. The memory 10 in FIG. 1 may be provided in a cache memory as a non-limiting example. The memory 10 is configured to receive a memory access request 12. The received memory access request 12 comprises a data entry address 14. The memory 10 uses the data entry address 14 to access a data entry 16 stored in a data array 17. In this example, the data array 17 is a SRAM data array 18. The data entry 16 may be comprised of one or more bitcells and/or comprised of a data entry row 16R or a data entry column 16C as illustrated in FIG. 1. The data entry address 14 may comprise the full memory address of a location in the SRAM data array 18 or only a portion of the memory address sufficient to access the data entry row 16R or data entry column 16C desired in the SRAM data array 18. The memory 10 is configured to accesses the data entry 16 at the data entry address 14 through a first data access path 20. The first data access path 20 is illustrated in FIG. 1 as a data path extending from a SRAM input 22 to the SRAM data array 18. The first data access path 20 illustrates an access path for memory access requests that do not involve addressing of defective data entries in the SRAM data array 18, which will be discussed in more detail below.

With continuing reference to FIG. 1, the memory access request 12 is provided along the first data access path 20 where the memory access request 12 encounters processing components. The processing components in the first data access path 20 comprise a memory access logic circuit 24 in this exemplary embodiment. The memory access logic circuit 24 processes the memory access request 12 so as to access the data entry 16 at the proper address in the SRAM data array 18. As an example, processing of the memory access request 12 begins by receiving the memory access request 12 comprising the data entry address 14 at a memory access logic circuit input 26. The memory access logic circuit 24 translates the data entry address 14 in the received memory access request 12 into an index 28. The memory access logic circuit 24 then provides the index 28 as an output on a memory access logic circuit output 30. The processing continues as the index 28 output on the memory access logic circuit output 30 is received by a data entry address index selector 32. The data entry address index selector 32 provides the index 28 to the SRAM data array 18 for accessing the data entry 16. Using the received index 28, the SRAM data array 18 accesses the data entry 16 in the SRAM data array 18 at the address of the memory access request 12. The SRAM data array 18 then provides the data entry 16 addressed by the memory access request 12 as output on a SRAM data array output 34.

It is possible that the data entry rows 16R or the data entry columns 16C at the data entry address 14 in the memory 10 may be defective. For example, the manufacturing process can create defects in the semiconductor die. The defects may result from processing instabilities, material non-uniformities, etc. Thus, the data entry rows 16R or data entry columns 16C may be defective as a result of the manufacturing process. A data entry row 16R or a data entry column 16C that is defective is otherwise known as a defective data entry 36. The defective data entry 36 may also be referred to as a defective data entry row 36R or a defective data entry column 36C. In the event a data entry row 16R or a data entry column 16C of the memory 10 at the data entry address 14 in the SRAM data array 18 is defective, a data entry redirection circuit 38 in FIG. 1 is configured to redirect the memory access request 12 to a redundant data entry 40 in the SRAM data array 18. The data entry redirection circuit 38 receives the memory access request 12 comprising the data entry address 14. The data entry redirection circuit 38 determines if the data entry address 14 is a defective data entry 36. If it is determined that the data entry 16 to which the data entry address 14 points is a defective data entry 36 in the SRAM data array 18, the data entry redirection circuit 38 can redirect the data entry address 14 to a redundant data entry 40 in the SRAM data array 18. In this manner, while the first data access path 20 is used to determine the index 28 for accessing the data entry 16, the data entry redirection circuit 38 is configured to redirect the indexing in the event a defective data entry 36 has been indexed by the first data access path 20.

With continued reference to FIG. 1, to avoid or reduce latency of the data entry redirection circuit 38, the data entry redirection circuit 38 is not provided in the first data access path 20 of the memory 10. Instead the data entry redirection circuit 38 is provided in a second data access path 42 in the memory 10 outside the first data access path 20. By providing the data entry redirection circuit 38 in the second data access path 42 outside of the first data access path 20, the data entry redirection circuit 38 can determine if the received data entry address 14 is defective prior to the data entry 16 access in the SRAM data array 18 at the data entry address 14. As a non-limiting example, the data entry redirection circuit 38 may determine if the received data entry address 14 is defective while the memory access logic circuit 24 is processing the received memory access request 12. Thus, latency of the data entry redirection circuit 38 provided in the second data access path 42 does not add to the latency of the first data access path 20 for the memory access request 12 in this example. More details regarding an exemplary process of the memory access request 12 being received by the memory 10 in FIG. 1 and being processed to provide access to data stored in the SRAM data array 18 at the data entry address 14 will now be described in conjunction with reference to FIG. 2.

Figure 2:
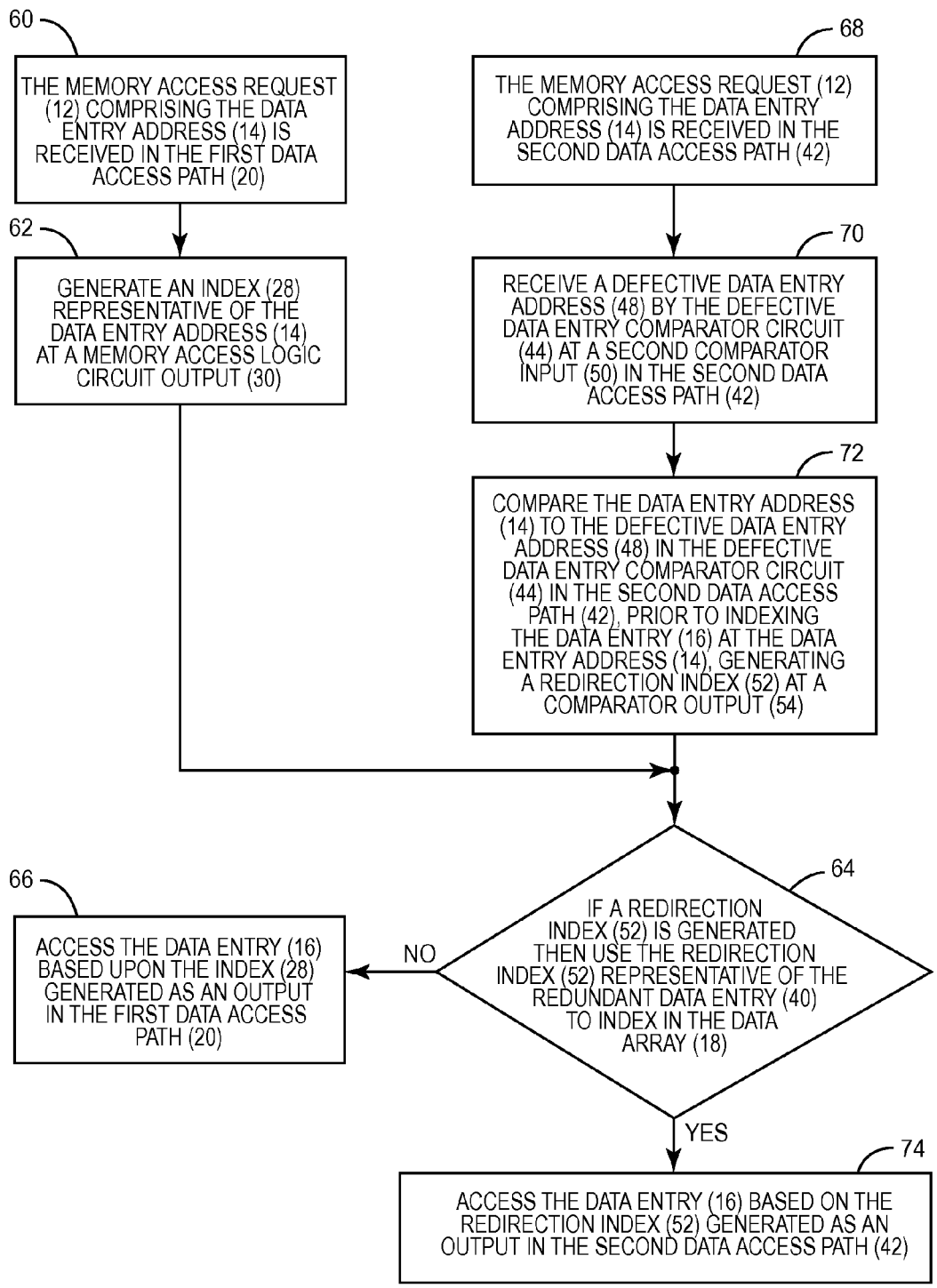
FIG. 2 is a flowchart illustrating an exemplary process for selecting either a data entry or a redundant data entry in a data array of the memory of FIG. 1 for a memory access request, based on whether the data entry at the data address for the memory access request is defective, prior to the data entry access in the data array.

In this regard, FIG. 2 is a flowchart illustrating exemplary processing of the memory access request 12 received by the memory 10 of FIG. 1. With reference to FIGS. 1 and 2, the memory access request 12 comprising the data entry address 14 is received in the first data access path 20 and the second data access path 42. In the first data access path 20 the memory access request 12 is received at a memory access logic circuit input 26 (block 60 in FIG. 2). The memory access logic circuit 24 processes the received memory access request 12 and generates an index 28 representative of the data entry address 14 at a memory access logic circuit output 30 (block 62 in FIG. 2). The memory access logic circuit 24 can decode the data entry address 14 in the received memory access request 12. Decoding of the data entry address 14 can translate the received memory access request 12 into the index 28 used to index the data entry 16 in the SRAM data array 18 corresponding to the memory access request 12. The additional bits of information may identify data entry row(s) 16R and/or column(s) 16C to be accessed in the SRAM data array 18. The index 28 is provided to the data entry address index selector 32. The data entry address index selector 32 then indexes the data entry 16 in the SRAM data array 18 based on a generated index. As will be discussed below, if a redirection index 52 is generated then use the redirection index 52 representative of the redundant data entry 40 to index the SRAM data array (block 64 in FIG. 2). In some embodiments, the data entry 16 may be a data entry row 16R or a data entry column 16C in the SRAM data array 18. The index 28 provided by the data entry address index selector 32 is then used to access the data entry 16 (block 66).

With continued reference to FIGS. 1 and 2, accessing of the redundant data entry 40 of the SRAM data array 18 via the second data access path 42 will now be described. Accessing the redundant data entry 40 via the second data access path 42 is performed separate, from accessing the data entry 16 via the first data access path 20 as described above. The second data access path 42 also receives the memory access request 12 (block 68 in FIG. 2). The second data access path 42 is comprised of the data entry redirection circuit 38. The data entry redirection circuit 38 provides processing components for the memory access request 12 in the second data access path 42. The data entry redirection circuit 38 is comprised of a defective data entry comparator circuit 44 and the data entry address index selector 32 in this example. The defective data entry comparator circuit 44 is configured to receive the data entry address 14 as an input at a first comparator input 46 for addressing the data entry 16 in the SRAM data array 18 in the second data access path 42.

With continued reference to FIGS. 1 and 2, the defective data entry comparator circuit 44 is further configured to receive a defective data entry address 48 at a second comparator input 50 (block 70 in FIG. 2). The defective data entry comparator circuit 44 compares the data entry address 14 and the defective data entry address 48. The defective data entry comparator circuit 44 determines if there is a match between the data entry address 14 and the defective data entry address 48. If it is determined that there is a match, the defective data entry comparator circuit 44 is configured to generate a redirection index 52 at a comparator output 54 (block 72 in FIG. 2). If the data entry address index selector 32 determines that a redirection index 52 was generated and should be used, the redirection index 52 representative of the redundant data entry 40 is used to index the SRAM data array 18 for access (block 64 in FIG. 2). Next, if it is determined that the redirection index 52 is generated in the second data access path 42 indicating a defective data entry 36 is to be referenced, then accessing the SRAM data array 18 is based on the redirection index 52 (block 74 in FIG. 2). However, as described above, if it is determined that there is not a match between the data entry address 14 and the defective data entry address 48, the data entry 16 referenced by the data entry address 14 is not deemed defective. In the scenario that the data entry 16 corresponding to the memory access request 12 is not determined to be defective, the data entry address index selector 32 provides the index 28 to index the data entry 16 in the SRAM data array 18 if no other index 28 is provided to the data entry address index selector 32 as described below (block 66 in FIG. 2).

With continued reference to FIGS. 1 and 2, the defective data entry address 48 received by the defective data entry comparator circuit 44 corresponds to the defective data entries 36 previously identified in the SRAM data array 18. The defective data entry address 48 is an address output from a defective data entry index register 56. The defective data entry index register 56 comprises a list of the defective data entry addresses 48, if any, determined to be in the SRAM data array 18. The list of the defective data entry addresses 48, corresponding to the defective data entries 36 in the SRAM data array 18, may be determined during the manufacturing process. As previously discussed, the manufacturing process of the memory 10 may result in defective data entry rows 36R or columns 36C in the SRAM data array 18. The defective data entry row 36R and the defective data entry column 36C in the SRAM data array 18 may be identified during various testing phases of the manufacturing process. If it is determined during these various testing phases that there are any defective data entry rows 36R or defective data entry columns 36C, the defective data entry index register 56 will be generated containing a list of the defective data entry addresses 48 identified, if any. The defective data entry addresses 48 will be used by the defective data entry comparator circuit 44 to determine if a data entry address 14 is a defective data entry 36.

Note that the defective data entry index register 56 can be any type of storage component or device that can store defective data entry addresses 48. For example, the defective data entry index register 56 could include a set of programmable fuses that are used to indicate the bit values of the defective data entry addresses 48 as a non-limiting example. The defective data entry index register 56 could also be comprised of circuit-based storage devices, including but not limited to CPU registers, store defective data entry addresses 48.

To avoid or reduce latency of the data entry redirection circuit 38 from adding latency to the memory access request 12 latency, the data entry redirection circuit 38 is not provided in the first data access path 20 of the memory 10 in embodiments discussed herein. Instead, the data entry redirection circuit 38 is provided in the second data access path 42 in the memory 10 outside of the first data access path 20. The data entry redirection circuit 38 receives the same data entry address 14 for the memory access request 12 in the second data access path 42. The data entry redirection circuit 38 redirects the data entry address 14 to a redundant data entry 40 in the SRAM data array 18 if the data entry address 14 points to a defective data entry 36 in the SRAM data array 18. By providing the data entry redirection circuit 38 in the second data access path 42 outside of the first data access path 20, the data entry redirection circuit 38 can determine if the requested data entry address 14 is defective and redirect the memory access request 12 to a redundant data entry 40 in the SRAM data array 18 prior to the data entry 16 access in the SRAM data array 18 at the data entry address 14. In this manner, latency of the data entry redirection circuit 38 is not provided as part of the first data access path 20 for memory access requests 12 that do not involve redirection to a redundant data entry 40 in the SRAM data array 18. The memory 10 may be provided for in different memory 10 applications, such as a SRAM cache memory, which is often used in higher performing applications. Thus, avoiding or reducing latency of the data entry redirection circuit 38 as part of the first data access path 20 for the memory access request 12 can be particularly advantageous.

Figure 3:
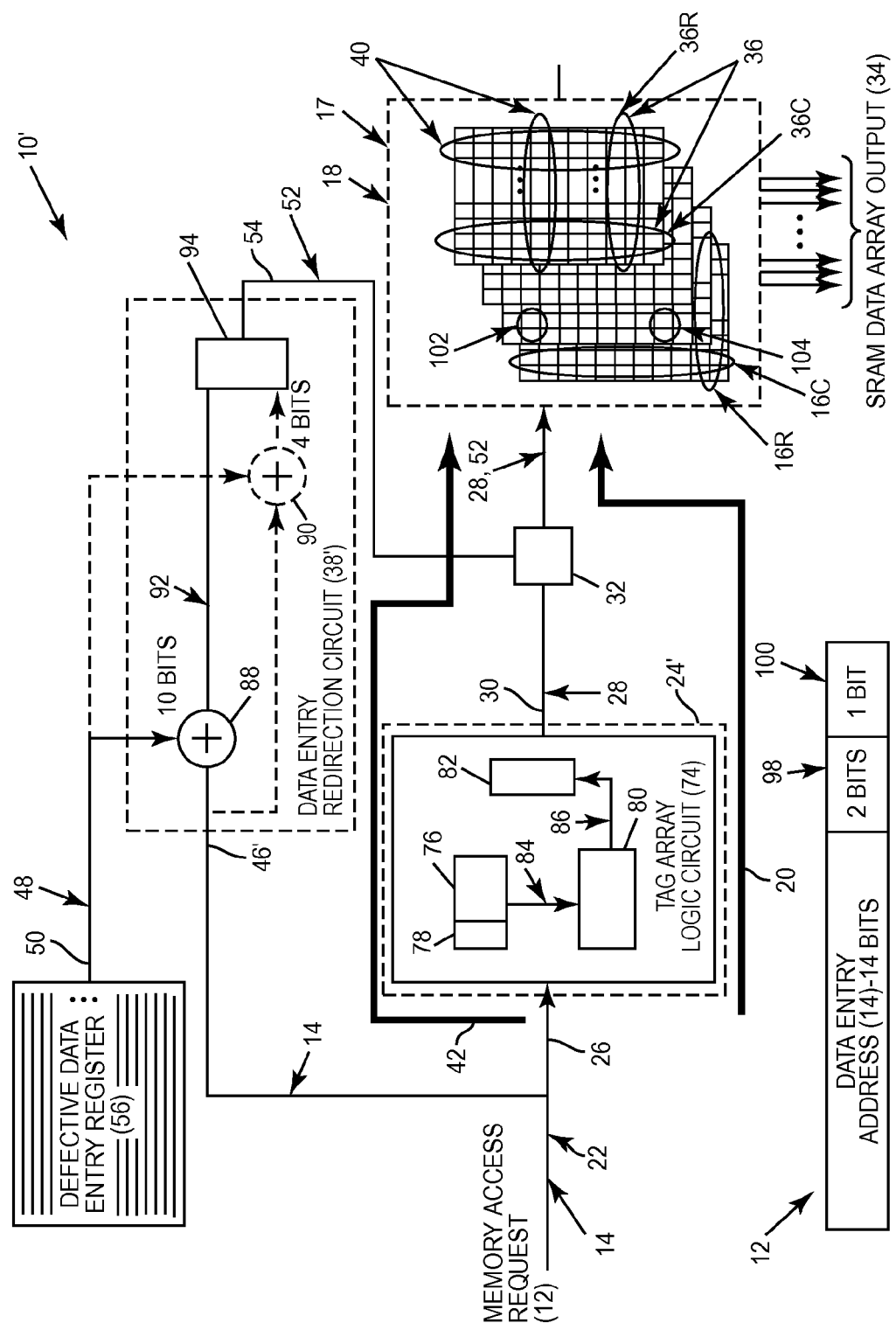
FIG. 3 is a schematic diagram of another exemplary memory provided as cache memory comprising a tag array and a data array, and further comprising a data entry redirection circuit for selecting a redundant data entry in the data array of the cache memory for a memory access request, if a data entry at a data address for the memory access request is defective, prior to the data entry access in the data array.

Memory that includes a data entry redirection circuit can be provided for different memory applications, as desired. For example, FIG. 3 illustrates an exemplary block diagram of cache memory 10' that includes a data entry redirection circuit 38' similar to the data entry redirection circuit 38 in the memory 10 in FIG. 1. The cache memory 10' includes a memory access logic circuit 24' and a data array 17 similar to that of FIG. 1. In this example, the data array 17 is a SRAM data array 18. The cache memory 10' is an exemplary embodiment of the schematic diagram of the memory 10 of FIG. 1. Common elements between the memory 10 in FIG. 1 and the cache memory 10' in FIG. 3 are noted with common element numbering and will not be re-described in accordance with FIG. 3. The memory access logic circuit 24' comprises a tag array logic circuit 74. The tag array logic circuit 74 is comprised of a tag column 76, a valid column 78, tag array logic 80, and a decoder logic circuit 82. The tag array logic circuit 74 is provided as an on-chip memory index for performing valid lookups for the data entries 16 in the SRAM data array 18. The tag array logic circuit 74 determines if there is a match between the data entry address 14 and the valid contents of the tag column 76.

With continued reference to FIG. 3, upon a determination that the data entry address 14 matches the contents of the tag column 76, the tag array logic 80 will determine if the received data entry address 14 is valid. The tag array logic 80 receives a referenced tag address 84 from the tag column 76. The tag array logic 80 then determines if the referenced tag address 84 is valid. If the referenced tag address 84 is valid, a "cache hit" results. However, if there is no referenced tag address 84 or if the referenced tag address 84 is determined to be invalid, a "cache miss" occurs. The decoder logic circuit 82 receives a valid tag address 86 from the tag array logic 80. Upon receipt of the valid tag address 86, the decoder logic circuit 82 resolves the address location of the data entry 16 in the SRAM data array 18. The tag array logic circuit 74 provides the index 28 as an output of the memory access logic circuit 24'. Similar to the memory 10 in FIG. 1, the memory access logic circuit 24' in the cache memory 10' of FIG. 3 provides the index 28 as an output to the data entry address index selector 32 for selecting a data entry 16 to access in the SRAM data array 18. However, in this exemplary embodiment, the index 28 will be provided as an output if a "cache hit" is determined in the tag array logic circuit 74. It should be noted that the tag array logic 80 will determine if the received data entry 16 is valid, resulting in either a "cache hit" or a "cache miss," even if it is determined that the data entry 16 is defective in the second data access path 42. In this manner, as described below, the processing in the second data access path 42 will determine if the data entry 16 is defective but does not replace the function of determining whether the data entry 16 is valid, resulting in either a "cache hit" or a "cache miss" performed in the first data access path 20.

With continued reference to FIG. 3, a data entry redirection circuit 38' similar to FIG. 1 is provided in the second data access path 42. The data entry redirection circuit 38' provides a similar function of comparing the data entry address 14 to the defective data entry address 48. The data entry redirection circuit 38' may be comprised of at least one defective data entry address comparator. In this non-limiting example, a first defective data entry address comparator 88, and optionally, a second defective data entry address comparator 90 are provided. The first defective data entry address comparator 88 is configured to compare at least a portion of the data entry address 14 to a defective data entry address 48. The second defective data entry address comparator 90 may be optionally provided to reduce the number of bits of the data entry address 14 that the first defective data entry address comparator 88 will need to compare with the defective data entry address 48. By reducing the number of bits in the data entry address 14 in each stage of this comparison, performance of the first defective data entry address comparator 88 may be increased as opposed to only providing a single comparator to compare all the bits in the data entry address 14. In alternative embodiments, more than two (2) comparison stages using a plurality of defective data entry address comparators may be used. As a non-limiting example, the first defective data entry address comparator 88 may compare the most significant X bits, and the second defective data entry address comparator 90 may compare the remaining least significant Y bits. A first portion of a resolved redundant address 92 is output to a defective logic circuit 94, which combines the results of the optional plurality of defective data entry address comparators. The output of the defective logic circuit 94 is the redirection index 52. The redirection index 52 is output to the data entry address index selector 32.

With continued reference to FIG. 3, the output of the defective logic circuit 94 is the redirection index 52 that is generated based on the comparison performed in the data entry redirection circuit 38'. The redirection index 52 is output to the data entry address index selector 32. The data entry address index selector 32 uses the redirection index 52, if provided, to index the SRAM data array 18 at the received redirection index 52 instead of the index 28 as described above. The indexing of the SRAM data array 18 at the redirection index 52 allows access to the redundant data entry 40. Upon access, the SRAM data array 18 will cause the value at the redundant data entry 40 to be output from the SRAM data array 18 on the SRAM data array output 34. The completion of the access by outputting the value in the redundant data entry 40 in the SRAM data array 18 completes access via the second data access path 42.

In continuing reference to FIG. 3, the latency of the memory access to the SRAM data array 18 is not increased as a result of the data entry redirection circuit 38'. To avoid or reduce latency of the data entry redirection circuit 38' adding latency to the memory access, the data entry redirection circuit 38' is provided in the second data access path 42 and not provided in the first data access path 20 of the memory 10. Further, to avoid latency of the data entry redirection circuit 38' adding latency to the memory access, the latency of the second data access path 42 containing the data entry redirection circuit 38' is less than the latency of the first data access path 20. Thus, the memory access latency will be the latency of the first data access path 20.

With continued reference to FIG. 3, the memory access request 12 is comprised of a memory access request (MAR) address 96 for addressing the data entry 16. The MAR address 96 is comprised of the data entry address 14. The data entry address 14 will be comprised of the most significant bits of the MAR address 96, wherein the data entry address 14 may have fewer bits than the MAR address 96. To fully resolve the data entry 16 address, all of the bits of the MAR address 96 are required. However, in the case where the data entry address 14 has fewer bits than the MAR address 96, there will be at least one column select bit 98 and/or at least one row select bit 100 that will not be included as a part of the data entry address 14. If the data entry address 14 is comprised of fewer bits than the MAR address 96, the data entry address 14 may address a plurality of data entry rows 16R and/or a plurality of data entry columns 16C.

With continued reference to FIG. 3, in this non-limiting example, the MAR address 96 has seventeen (17) bits. The seventeen (17) bits provided in the MAR address 96 are used to fully resolve a memory location. The data entry address 14 provided in the MAR address 96 has fourteen (14) bits. In this example, the at least one column select bit 98 is comprised of two (2) bits because it addresses one (1) out of four (4) of a plurality of columns 102. Additionally, in this example, the at least one row select bit 100 is comprised of one (1) bit because it addresses one (1) out of two (2) rows of a plurality of rows 104. Thus, the MAR address 96 has a total of seventeen (17) bits. The seventeen (17) bits in the MAR address 96 are comprised of the fourteen (14) bits for the data entry address 14, the two (2) column select bits 98, and the one (1) row select bit 100. The number of bits in the at least one column select bit 98 and the number of bits in the at least one row select bit 100 are determined by design choices.

With continued reference to FIG. 3, the design choices may include a column mux circuit scheme and/or row replacement pairing of the SRAM data array 18. As a non-limiting example, a cache memory 10' design may comprise a 4-1 (four-to-one) column mux circuit scheme, where there are four (4) columns in the plurality of columns 102 which share one (1) set of dedicated periphery circuits (e.g., column decoders, write drivers, sense amplifiers, and control/clocking circuitry, etc.). A defective data entry 36 in a 4-1 column mux circuit scheme requires the redirection of all four (4) columns of the plurality of columns 102, due to the shared dedicated periphery circuits. In this example of a 4-1 column mux circuit scheme, the two (2) column select bits 98 in the MAR address 96 representing the four (4) columns in the plurality of columns 102 are not required. The two (2) column select bits 98 are not required because the four (4) columns in the plurality of columns 102 are replaced or redirected for a single column redirect action in this example. The two (2) column select bits 98 representing four (4) of the plurality of columns 102 would be used if a column within the 4-1 column mux circuit scheme needs to be redirected.

With continued reference to FIG. 3, as an additional non-limiting example, two (2) rows of the plurality of rows 104 may be replaced in a single row redirect action. The two (2) rows of the plurality of rows 104 may be replaced for similar reasons to the four (4) columns 98 being replaced in a single column redirect action in the 4-1 column mux circuit scheme described above. The two (2) rows of the plurality of rows 104 may be replaced in a single row redirect action because, in this example, the two (2) rows of the plurality of rows 104 share periphery circuits for controlling access to the plurality of rows 104. If two (2) rows of the plurality of rows 104 are replaced in a single row redirect action, the row select bit 100 is not required. The row select bit 100 is not require because it is not necessary to determine which of the two (2) rows of the plurality of rows 104 are to be replaced with the redundant data entry 40.

With continued reference to FIG. 3, as described above, any latency of the data entry redirection circuit 38' is not provided as part of the first data access path 20 for memory access requests 12. Thus, the overall memory access latency of the cache memory 10' is not increased due to the data entry redirection circuit 38' while providing for redundant row and/or columns of the data entries 16 in the SRAM data array 18.

Further, the processing of memory access requests 12(0)-12(N) in the cache memory 10' in FIG. 3 may also be pipelined. As will be discussed in more detail below with regard to FIG. 4, the processing of the memory access request 12(0)-12(N) in the cache memory 10' can be provided in a series of different processing stages. Each processing stage can be configured to provide a particular designated processing function for a memory access request 12(0)-12(N) while other processing stages process other memory access requests 12(0)-12(N). In this manner, the processing stages in the cache memory 10' can be more fully utilized as opposed to having idle times waiting on other processing stages to be completed before a next memory access request 12(0)-12(N) can be processed.

Figure 4:
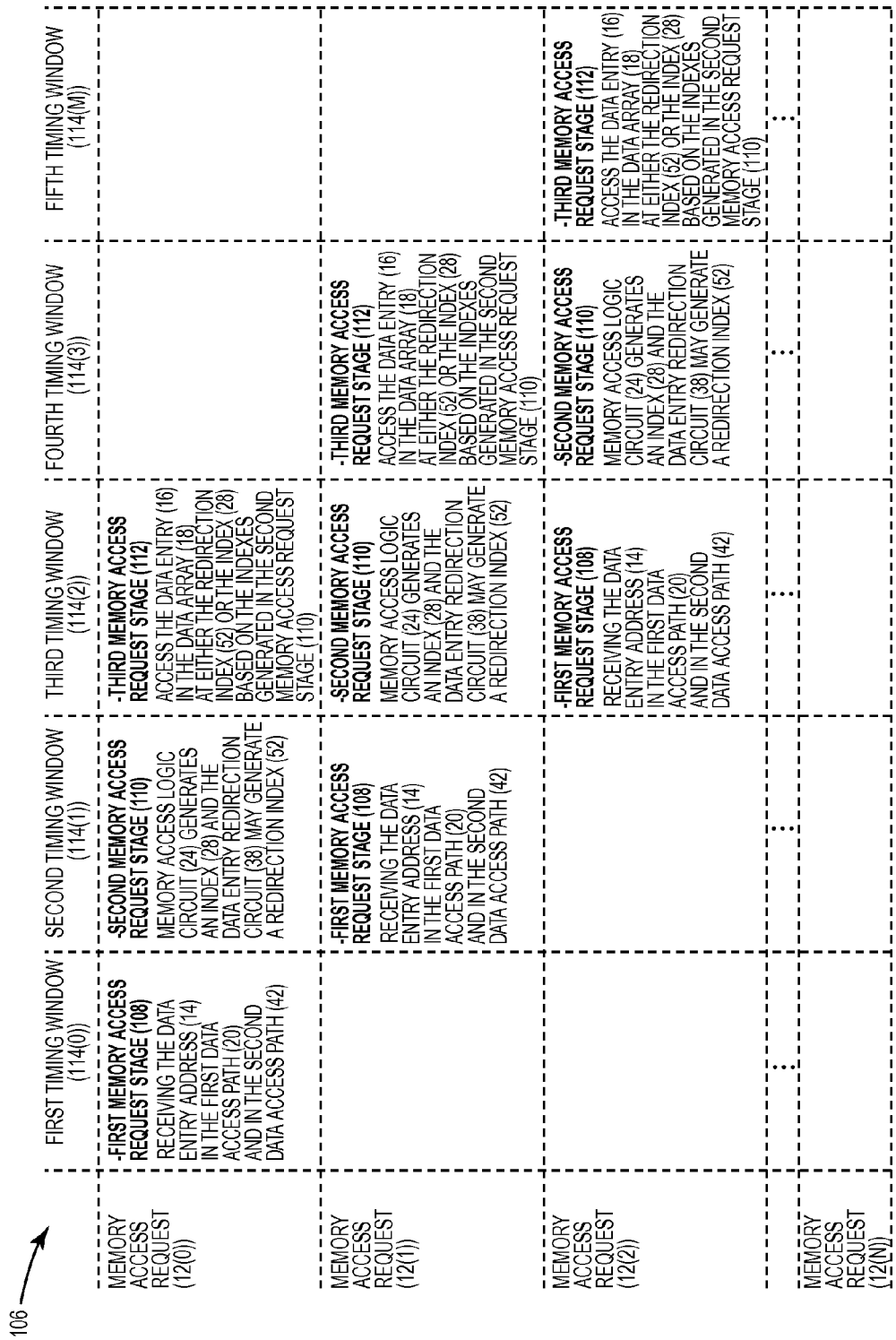
FIG. 4 is a schematic diagram illustrating a plurality of exemplary timing windows illustrating a plurality of memory access requests processed in a pipelined fashion for selecting redundant data entries in the data array of the cache memory of FIG. 3 for memory access requests, if the data entry at the data address for a memory access request is defective, prior to the data entry access in the data array.

In this regard, FIG. 4 is an exemplary timing diagram 106 that illustrates a plurality of memory access requests 12(0)-12(N) processed in a pipelined fashion in the cache memory 10' of FIG. 3. Processing the plurality of memory access requests 12(0)-12(N) in a pipelined fashion allows for overlapping execution of each one of the plurality of memory access requests 12(0)-12(N). To process a memory access request 12 in a pipelined fashion, the memory access request 12 is divided into a plurality of access stages.

With continued reference to FIG. 4, three (3) memory access request 12 stages for a plurality of pipelined memory access request 12(0)-12(N) stages are illustrated in the following non-limiting example. A first memory access request stage 108 comprises receiving the data entry address 14 in the first data access path 20 and the second data access path 42. A second memory access request stage 110 is comprised of a defective data entry comparator circuit 44 further receiving at least one defective data entry address 48 in the second data access path 42. The second memory access request stage 110 is further comprised of comparing the data entry address 14 to the at least one defective data entry address 48 corresponding to the defective data entries 36 in the SRAM data array 18. The defective data entry comparator circuit 44 performs the comparison in the second data access path 42, prior to indexing the data entry 16 at the data entry address 14. Additionally, the defective data entry comparator circuit 44 generates the redirection index 52 if the data entry address 14 matches the at least one defective data entry address 48. A match indicating that the data entry address 14 results in a defective data entry 36. A third memory access request stage 112 is comprised of the data entry address index selector 32 selecting a redirection index 52 if the redirection index 52 is generated. However, if a redirection index 52 is not generated, the data entry address index selector 32 uses the index 28 representative of the data entry address 14 to index the SRAM data array 18. The third memory access request stage 112 is further comprised of accessing the SRAM data array 18 at either the redundant data entry 40 represented by the redirection index 52 or at the data entry 16 represented by the index 28. In an alternative embodiment, a memory access request 12 may be processed in greater or fewer than three (3) access stages. Each one of the plurality of memory access requests 12(0)-12(N) is processed within at least one timing window 114(0)-114(M). Additionally, each one of the plurality of memory access requests 12(0)-12(N) may be executed in a pipelined fashion with a plurality of access stages corresponding to separate memory access requests 12(0)-12(N) being executed in the same timing window 114(0)-114(M).

With continuing reference to FIG. 4, the memory access request 12(0) begins processing of the first memory access request stage 108 in the first timing window 114(0). The processing of the first memory access request 12(0) then progresses to the second memory access request stage 110 in a second timing window 114(1). During the second timing window 114(1), a memory access request 12(1) may also begin to execute in the first memory access request stage 108. It should be noted that both the second memory access request stage 110 of the memory access request 12(0) and the first memory access request stage 108 of the memory access request 12(1) are being processed during the second timing window 114(1), in this example. The memory access request 12(0) and the memory access request 12(1) then progress processing to a third timing window 114(2). In the third timing window 114(2), the memory access request 12(0) progresses to the third memory access request stage 112 of processing and the memory access request 12(1) progresses to the second memory access request stage 110 of processing. Additionally, a memory access request 12(2) begins processing in the first memory access request stage 108. The processing of the memory access request 12(2) is processed similarly to the memory access requests 12(0), 12(1). The memory access request 12(2) is processed in timing windows 114(2)-114(M) and will not be re-described here. In this manner, the memory access requests 12(0)-12(N) may be pipelined into stages of execution, allowing for simultaneous execution of a plurality of access stages 108, 110, 112 for each of the memory access requests 12(0)-12(N).

Redirecting data from a defective data entry in memory to a redundant data entry prior to data access and related systems and methods according to embodiments disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 5:
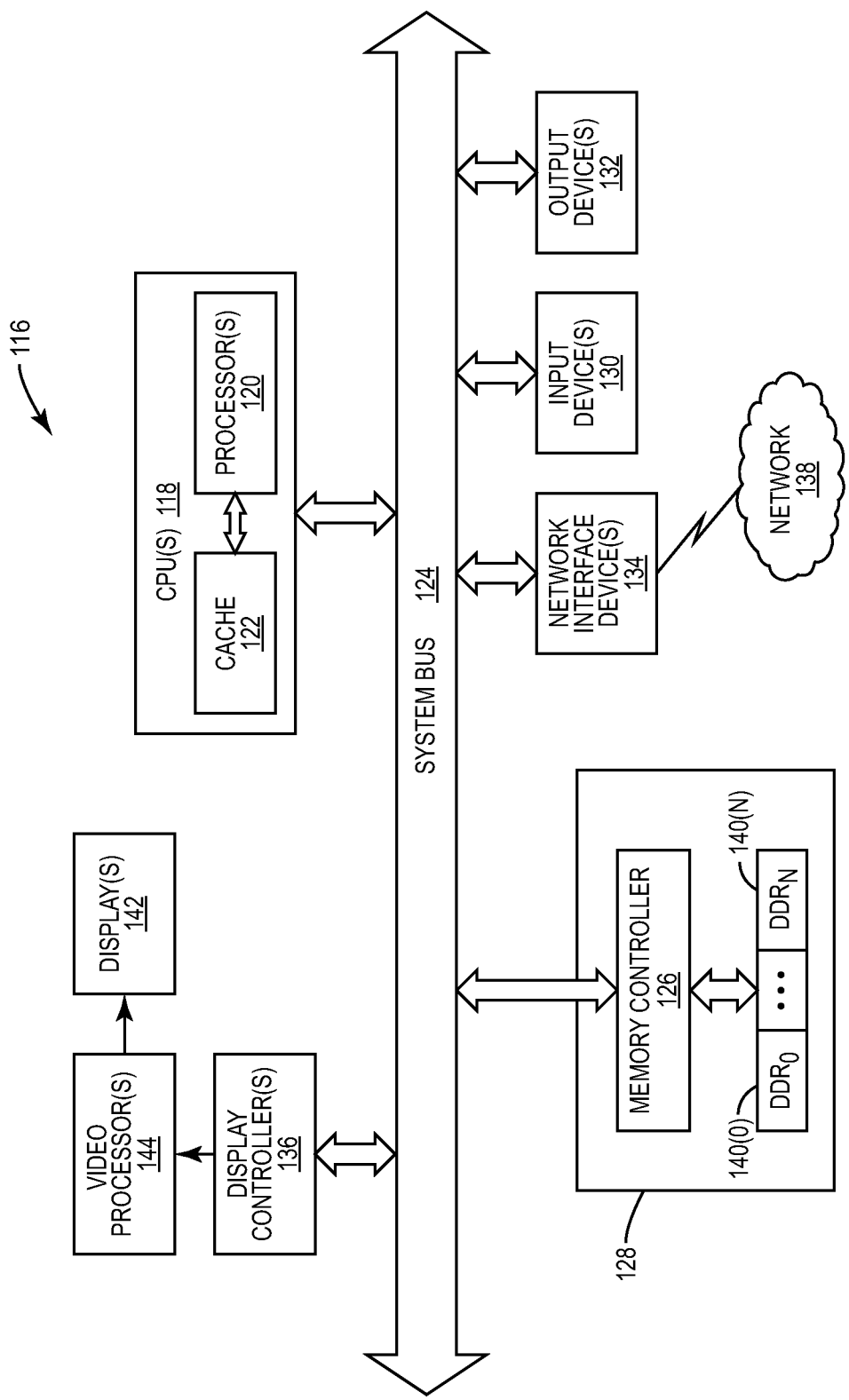
FIG. 5 is a block diagram of an exemplary processor-based system that includes memory comprising a data entry redirection circuit for selecting a redundant data entry in a data array of the memory for a memory access request, if a data entry at a data address for a memory access request is defective, prior to the data entry access in the data array, including without limitation, the memory in FIG. 1 and FIG. 3.

In this regard, FIG. 5 illustrates an example of a processor-based system 116 that can employ systems and methods for redirecting data from a defective data entry 36 to a redundant data entry 40 prior to data access. In this example, the processor-based system 116 includes one or more CPUs 118, each including one or more processors 120. The CPU(s) 118 may have cache memory 122 coupled to the processor(s) 120 for rapid access to temporarily stored data. The CPU(s) 118 is coupled to a system bus 124 and can intercouple master and slave devices included in the processor-based system 116. As is well known, the CPU(s) 118 communicates with these other devices by exchanging address, control, and data information over the system bus 124. For example, the CPU(s) 118 can communicate bus transaction requests to a memory controller 126 as an example of a slave device. Although not illustrated in FIG. 5, multiple system buses 124 could be provided, wherein each system bus 124 constitutes a different fabric.

Other master and slave devices can be connected to the system bus 124. As illustrated in FIG. 5, these devices can include a memory system 128, one or more input devices 130, one or more output devices 132, one or more network interface devices 134, and one or more display controllers 136, as examples. The input device(s) 130 can include any type of input device, including but not limited to input keys, switches, voice processors, etc. The output device(s) 132 can include any type of output device, including but not limited to audio, video, other visual indicators, etc. The network interface device(s) 134 can be any devices configured to allow exchange of data to and from a network 138. The network 138 can be any type of network, including but not limited to a wired or wireless network, a private or public network, a local area network (LAN), a wide local area network (WLAN), and the Internet. The network interface device(s) 134 can be configured to support any type of communication protocol desired. The memory system 128 can include one or more memory units 140(0-N).

The CPU(s) 118 may also be configured to access the display controller(s) 136 over the system bus 124 to control information sent to one or more displays 142. The display controller(s) 136 sends information to the display(s) 142 to be displayed via one or more video processors 144, which process the information to be displayed into a format suitable for the display(s) 142. The display(s) 142 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The master devices, and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A memory, comprising:
 a memory access logic circuit provided in a first data access path, the memory access logic circuit configured to:
  receive at least a portion of a data entry address of a memory access request as an input for addressing a data entry in a data array in the first data access path; and
  generate an index as an output in the first data access path, the index comprising a data entry address index to index the data array to access the data entry in the data array corresponding to the at least a portion of the data entry address;
 a data entry redirection circuit, comprising:
  a defective data entry comparator circuit provided in a second data access path separate from the first data access path, the defective data entry comparator circuit configured to, prior to indexing the data entry in the data array:
   receive at least one defective data entry address as an input from a defective data entry index register representative of the at least one defective data entry address in the data array at a comparator second input;
   compare the at least a portion of the data entry address to the received at least one defective data entry address; and
   generate a redirection index as an output in the second data access path, the redirection index comprising a redirection data entry address index to a redundant data entry in the data array if the received at least a portion of the data entry address matches the received at least one defective data entry address; and
  a data entry address index selector configured to select the redirection index to index the data array if the received at least a portion of the data entry address does match the at least one received defective data entry address.

2. The memory of claim 1, wherein the data entry address index selector is further configured to select the index to index the data array if the received at least a portion of the data entry address does not match the at least one received defective data entry address.

3. The memory of claim 1, wherein the defective data entry comparator circuit comprises a plurality of comparison stages for comparing the received at least a portion of the data entry address to the received at least one defective data entry address.

4. The memory of claim 1, wherein the received at least one defective data entry address may indicate at least one defective row or at least one defective column in the data array.

5. The memory of claim 1, wherein the at least a portion of the data entry address represents at least one row of data entries or at least one column of data entries in the data array.

6. The memory of claim 1, wherein the data entry redirection circuit is further configured to receive the at least a portion of the data entry address as an input for addressing the data entry in the data array in the second data access path at a comparator first input.

7. The memory of claim 6, wherein the data entry redirection circuit is configured to receive at least a portion of a data entry address for a second memory access request as a second input for addressing a second data entry in the data array in the first data access path, while generating the redirection index as the output in the second data access path to the redundant data entry in the data array if the received at least a portion of the data entry address for a first memory access request matches the received at least one defective data entry address.

8. The memory of claim 7, wherein the data entry redirection circuit is configured to generate a second redirection index as the output in the second data access path, while the data entry address index selector is configured to select the redirection index to index the data array if the received at least a portion of the data entry address does match the received at least one defective data entry address.

9. The memory of claim 1 comprised of cache memory, wherein the data array is comprised of a SRAM data array.

10. The memory of claim 9, wherein the memory access logic circuit is comprised of a tag array for indexing the data array prior to the data array access.

11. The memory of claim 10, wherein the tag array generates the index as the output in the first data access path.

12. The memory of claim 1, wherein the memory access logic circuit and the defective data entry comparator circuit are configured to receive the at least a portion of the data entry address as the input for indexing the data entry in the data array in a first timing window.

13. The memory of claim 12, wherein the defective data entry comparator circuit is configured to compare the received at least a portion of the data entry address to the received at least one defective data entry address in a second timing window prior to the memory access logic circuit indexing, as the output, the data entry in the data array in the first data access path at the at least a portion of the data entry address representative of the received at least a portion of the data entry address in a third timing window.

14. The memory of claim 1 integrated into an integrated circuit.

15. The memory of claim 1 integrated into a device selected from the group consisting of a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

16. A memory, comprising:
a memory access logic circuit means provided in a first data access path means, the memory access logic circuit means for:
receiving at least a portion of a data entry address means of a memory access request means as an input for addressing a data entry means in a data array means in the first data access path means; and
generating an index means as an output in the first data access path means, the index means comprising a data entry address index means for indexing the data array means to access the data entry means in the data array means corresponding to the at least a portion of the data entry address means;
a data entry redirection circuit means, comprising:
a defective data entry comparator circuit means provided in a second data access path means separate from the first data access path means, the defective data entry comparator circuit means for, prior to indexing the data entry means in the data array means:
receiving at least one defective data entry address means as an input means from a defective data entry index register means representative of the defective data entry address means in the data array means at a comparator second input means;
comparing the at least a portion of the data entry address means to the received at least one defective data entry address means; and
generating a redirection index means as an output in the second data access path means, the redirection index means comprising a redirection data entry address index means to a redundant data entry means in the data array means if the received at least a portion of the data entry address means matches the received at least one defective data entry address means; and
a data entry address index selector means for selecting the redirection index means to index the data array means if the received at least a portion of the data entry address means does match the at least one received defective data entry address means.

17. A method of redirecting a defective data entry to a redundant data entry in a data array, comprising:
receiving at least a portion of a data entry address of a memory access request in a first data access path and a second data access path for indexing a data entry in a data array;
indexing the data entry in the data array in the first data access path at a data entry index representative of the at least a portion of the data entry address;
comparing the at least a portion of the data entry address to a defective data entry address representative of a defective data entry in the data array in a defective data entry address comparator circuit in the second data access path, prior to indexing the data entry at the at least a portion of the data entry address;
indexing the data entry in the data array at a redirection index as the data entry index, if the comparison generates a match between the at least a portion of the data entry address and the defective data entry address; and
accessing the data entry in the data array at the redirection index as the data entry index, if the comparison generates the match between the at least a portion of the data entry address and the defective data entry address.

18. The method of claim 17, further comprising accessing the data entry in the data array at the data entry index as the data entry index, if the at least a portion of the data entry address does not match the defective data entry address.

19. The method of claim 17, further comprising receiving the at least a portion of the data entry address in the first data access path and the second data access path for indexing the data entry in the data array, wherein the at least a portion of the data entry address represents at least one row of data entries or at least one column of data entries in the data array.

20. The method of claim 18, further comprising comparing the at least a portion of the data entry address to the defective data entry address representative of the defective data entry in the data array in the defective data entry address comparator circuit, wherein the defective data entry address comparator circuit is configured to compare the received at least a portion of the data entry address to the defective data entry representative of the defective data entry in a plurality of comparison stages.

21. The method of claim 17, further comprising receiving at least a portion of a data entry address for a second memory access request as a second input for addressing a second data entry in the data array in the first data access path and a second data access path for indexing a second data entry in the data array, while comparing the at least a portion of the data entry address to the defective data entry address representative of the defective data entry in the data array in the defective data entry address comparator circuit in the second data access path, prior to indexing the data entry at the at least a portion of the data entry address.

22. The method of claim 21, further comprising comparing the at least a portion of the data entry address for the second memory access request to a second defective data entry address representative of a second defective data entry in the data array in the defective data entry address comparator circuit in the second data access path, while accessing the data entry in the data array at the redirection index as the data entry index, if the comparison generates the match between the at least a portion of the data entry address and the defective data entry address.

23. The method of claim 17, further comprising receiving the at least a portion of the data entry address in the first data access path for indexing the data entry in the data array, wherein the data array is cache memory.

24. The method of claim 21, further comprising receiving the at least a portion of the data entry address in the first data access path for indexing the data entry in the data array, wherein a tag array receives the at least a portion of the data entry address.

\* \* \* \* \*